United States Patent
Sugiarto

(10) Patent No.: US 10,054,660 B2
(45) Date of Patent: Aug. 21, 2018

(54) ELECTRIC MOTOR CONTROL SYSTEM WITH CURRENT SENSOR OFFSET CORRECTION

(71) Applicant: DELPHI TECHNOLOGIES IP LIMITED, St. Michael (BB)

(72) Inventor: Tanto Sugiarto, West Lafayette, IN (US)

(73) Assignee: DELPHI TECHNOLOGIES IP LIMITED (BB)

( * ) Notice: Subject to any disclaimer, the term of this patent is extended or adjusted under 35 U.S.C. 154(b) by 0 days.

(21) Appl. No.: 15/371,598

(22) Filed: Dec. 7, 2016

(65) Prior Publication Data

US 2018/0156885 A1    Jun. 7, 2018

(51) Int. Cl.

| G01R 1/02 | (2006.01) |
|---|---|
| G01R 35/00 | (2006.01) |
| G01R 31/02 | (2006.01) |
| B60L 15/02 | (2006.01) |
| B60L 11/18 | (2006.01) |

(52) U.S. Cl.
CPC ............ *G01R 35/005* (2013.01); *B60L 15/02* (2013.01); *G01R 31/025* (2013.01); *B60L 11/1803* (2013.01); *B60L 2210/40* (2013.01)

(58) Field of Classification Search
CPC ........ G01R 13/30; G01R 17/14; G01R 17/22; G01R 31/3191; G01R 33/0017; G01R 33/0035; G05B 2219/37545; G05B 2219/39048; G05B 2219/39052; G05B 2219/42152; G07D 2205/0012; G08B 29/20

See application file for complete search history.

(56) References Cited

U.S. PATENT DOCUMENTS

| 6,278,255 | B1 | 8/2001 | Yoo et al. |
|---|---|---|---|
| 2005/0206341 | A1 | 9/2005 | Yin Ho |
| 2005/0242767 | A1 | 11/2005 | Ho |
| 2005/0280383 | A1 | 12/2005 | Kifuku |
| 2009/0052215 | A1 | 2/2009 | Watanabe |
| 2009/0134835 | A1 | 5/2009 | Welchko et al. |
| 2014/0091742 | A1 | 4/2014 | Suzuki et al. |
| 2014/0253004 | A1 | 9/2014 | Gebregergis et al. |
| 2015/0123671 | A1* | 5/2015 | Yannam ............... G01M 99/005 324/511 |
| 2016/0276969 | A1* | 9/2016 | Krefta ................. H02P 29/0088 |
| 2016/0301341 | A1 | 10/2016 | Lee |
| 2017/0085205 | A1 | 3/2017 | Koseki et al. |

FOREIGN PATENT DOCUMENTS

EP        1729405 A1    12/2006

* cited by examiner

*Primary Examiner* — Tung X Nguyen
(74) *Attorney, Agent, or Firm* — Joshua M. Haines

(57) ABSTRACT

An electric-motor-control system with current sensor offset correction includes three current-sensors and a controller. Each of the three current-sensors is used to detect current through one of three windings of a Y-connected motor. The controller is in communication with the three current-sensors. The controller records periodically measurements of sensed-current indicated by each current-sensor while variable-current flows through each of the three windings, determines an x-offset and a y-offset of a rotating-vector indicated by a plurality of the measurements, and determines an offset-current of each of the three current-sensors based on the x-offset and the y-offset.

2 Claims, 4 Drawing Sheets

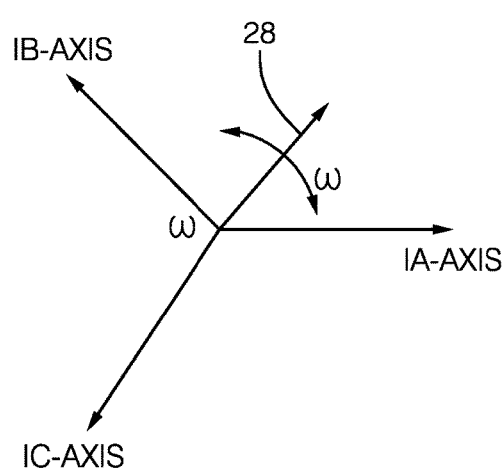 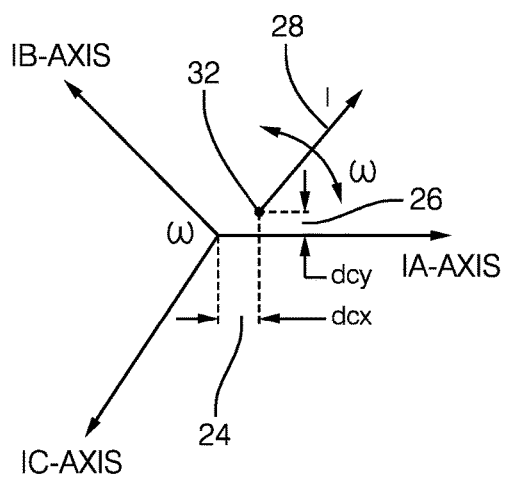
FIG. 2A  FIG. 2B
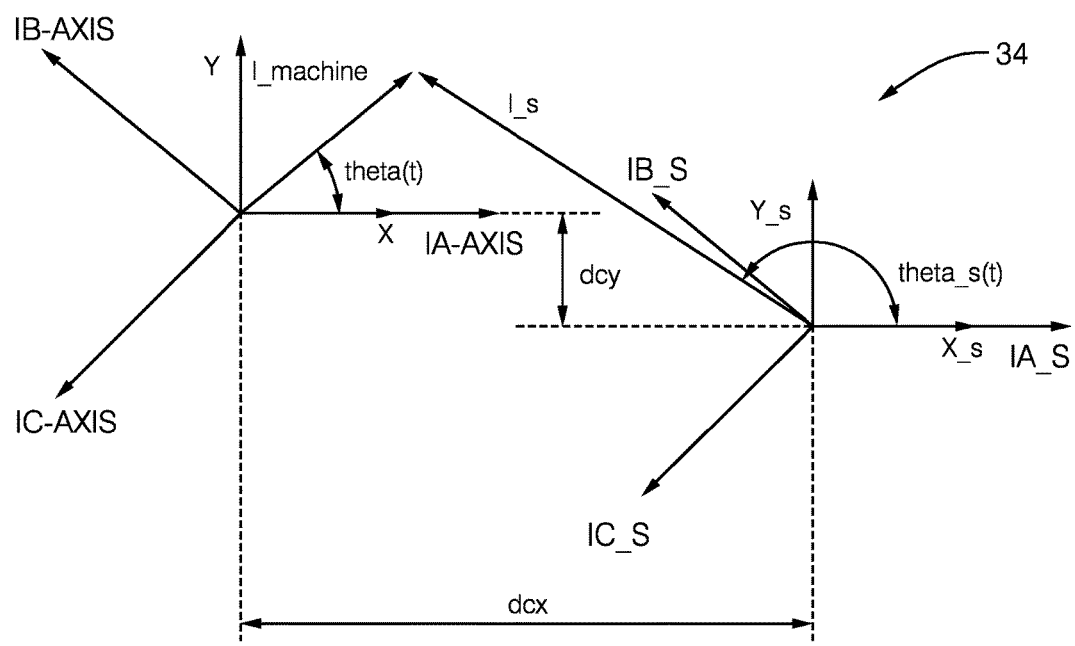
FIG. 3

ELECTRIC MOTOR CONTROL SYSTEM WITH CURRENT SENSOR OFFSET CORRECTION

TECHNICAL FIELD OF INVENTION

This disclosure generally relates to an electric-motor-control system, and more particularly relates to a system that records periodically measurements of sensed-current indicated by three current-sensors while variable-current flows through each of three motor-windings, determines an x-offset and a y-offset of a rotating-vector indicated by a plurality of the measurements, and determines an offset-current of each of the three current-sensors based on the x-offset and the y-offset.

BACKGROUND OF INVENTION

In AC motor control applications for electric vehicle traction drive, it is desirable to maintain torque accuracy within tight tolerance band, e.g. +/−5%. However, torque is typically not a directly measured quantity. Instead, it is a predicted quantity, derived from measured phase current signals, and estimated motor parameters. Therefore, having accurate current measurement and estimated motor parameters are advantageous for maintaining tight torque requirement. It is known that economical current sensors have a DC offset bias that needs to be corrected to maintain accuracy. The correction is typically performed during an off-state when no motor-current is flowing. However, if there is a drift of the DC offset characteristic during operation, the drift will go undetected and therefore uncompensated.

SUMMARY OF THE INVENTION

What is needed is a means or method in which DC offset can be detected while there is free current circulation without any regulation being applied inside three-phase machines.

In accordance with one embodiment, an electric-motor-control system with current sensor offset correction is provided. The system includes three current-sensors and a controller. Each of the three current-sensors is used to detect current through one of three windings of a Y-connected motor. The controller is in communication with the three current-sensors. The controller records periodically measurements of sensed-current indicated by each current-sensor while variable-current flows through each of the three windings, determines an x-offset and a y-offset of a rotating-vector indicated by a plurality of the measurements, and determines an offset-current of each of the three current-sensors based on the x-offset and the y-offset.

Further features and advantages will appear more clearly on a reading of the following detailed description of the preferred embodiment, which is given by way of non-limiting example only and with reference to the accompanying drawings.

BRIEF DESCRIPTION OF DRAWINGS

The present invention will now be described, by way of example with reference to the accompanying drawings, in which:

FIG. 2A is a conceptual illustration of a rotating current vector without the effect of current sensor DC offset in accordance with one embodiment;

FIG. 2B is a conceptual illustration of a rotating current vector that includes the effect of current sensor DC offset in accordance with one embodiment;

FIG. 3 is a conceptual illustration of projecting current sensor data onto an orthogonal frame by the system of FIG. 1 in accordance with one embodiment;

DETAILED DESCRIPTION

Figure 1:
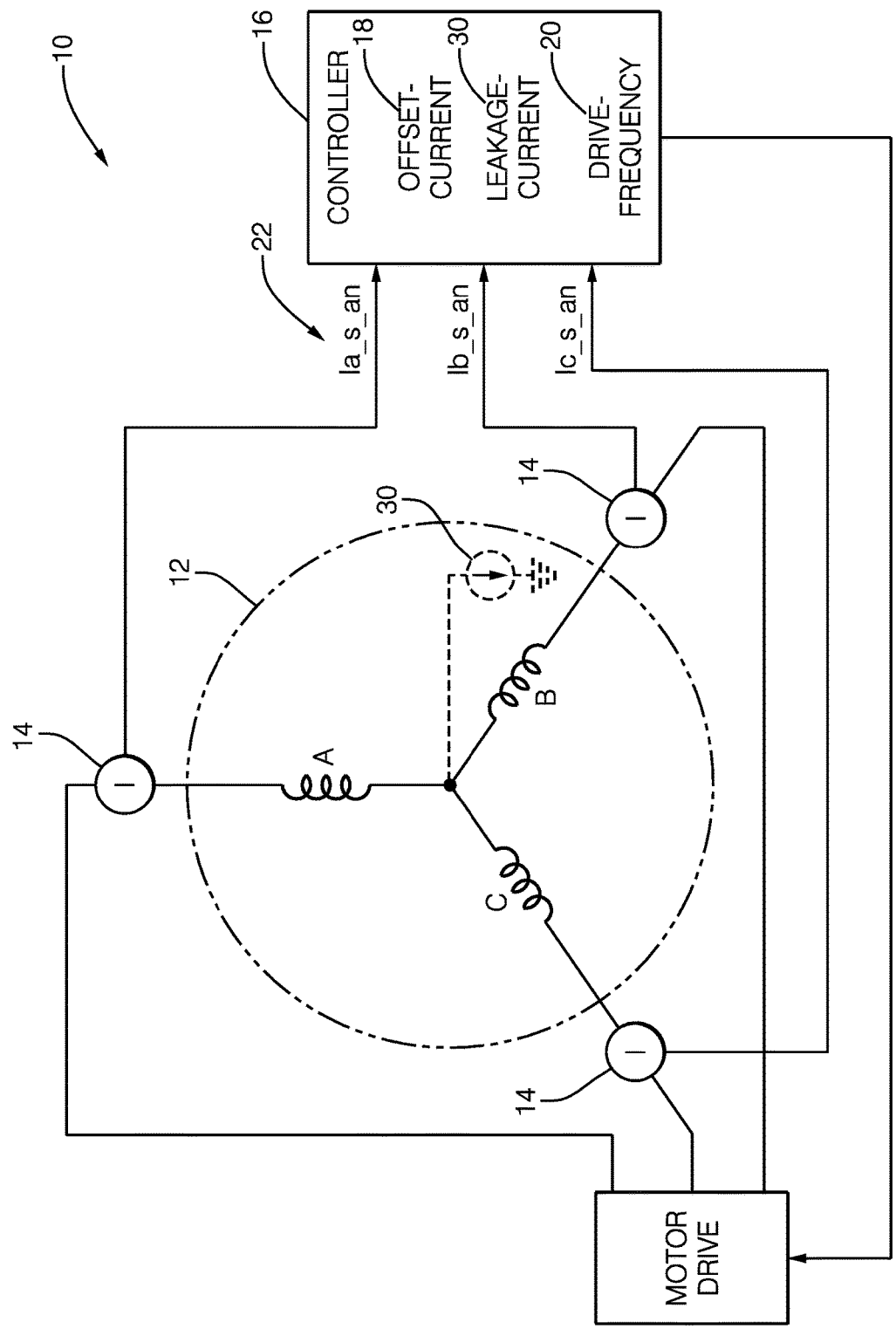
FIG. 1 is a diagram of an electric-motor-control system in accordance with one embodiment.

FIG. 1 illustrates a non-limiting example of an electric-motor-control system 10, hereafter referred to as the system 10. The system 10 provides for current sensor direct-current (DC) offset correction, and does so while current is flowing through a motor 12. The system 10 includes three current-sensors 14. Each of the three current-sensors 14 is used to detect current through one of three windings of the motor 12 which is characterized as a Y-connected motor and is sometime referred to as an alternating-current (AC) motor. As will be recognized by those in the art, alternating-current is used to operate the motor 12, where the alternating-current is typically in the form of a sinusoidal waveform. The system 10 described herein is advantageous over prior motor control systems that are only able to determine the offset-current 18, i.e. the DC offset-current, of current sensors when there is no current flowing through the windings of the motor being controlled. The advantage is realized because it is possible that the offset-current 18 of a current sensor changes over time and changes with temperature. The system 10 described herein is able to monitor the offset-current 18 characteristic of each of the three current-sensors 14 while the motor 12 is being operated, i.e. while current is flowing through the motor 12, which can cause a change in the operating temperature of the three current-sensors 14.

The system 10 includes a controller 16 in communication with the three current-sensors 14. The controller 16 may include a processor (not specifically shown) such as a microprocessor or other control circuitry such as analog and/or digital control circuitry including an application specific integrated circuit (ASIC) for processing data as should be evident to those in the art. The controller 16 may include memory (not specifically shown), including non-volatile memory, such as electrically erasable programmable read-only memory (EEPROM) for storing one or more routines, thresholds, and captured data. The one or more routines may be executed by the processor to perform steps for determining the offset-current 18 characteristics of the three current-sensors 14 based on signals received by the controller 16 from the three current-sensors 14 as described herein.

In order to determine the offset-current 18 characteristics of the three current-sensors 14, the controller 16 records periodically measurements of sensed-current indicated by each current-sensor while variable-current flows through each of the three windings of the motor 12. The controller 16 may be equipped with an analog-to-digital converter (A2D, FIG. 4) used to capture or sample analog-signals 22 (Ia_s_an, Ib_s_an, Ic_s_an) output by the three current-sensors 14. As used herein the term 'records periodically' means that a plurality of measurements of the analog-signals 22 are recorded over time, typically at a constant or steady sampling-frequency or sampling-rate, however, this is not a requirement. As will be recognized by those in the art, it is preferable that the sampling-frequency is substantially greater than the drive-frequency 20. By way of example and not limitation, a suitable value for the drive-frequency 20 of the motor 12 is 100 Hz, and a suitable value for sampling-frequency is 1500 Hz.

Once a sufficient number of samples of the analog-signals 22 are collected, thirteen for example (determined by empirical testing), the controller 16 determines an x-offset 24 (FIG. 2B) and a y-offset 26 of a rotating-vector 28 indicated by the plurality of the measurements, and determines an offset-current 18 of each of the three current-sensors 14 based on the x-offset 24 and the y-offset 26. It is noted that the origin 32 of the rotating-vector 28 can be used to determine the x-offset 24 and the y-offset 26, and the values of the x-offset 24 and the y-offset 26 can be used to determine the offset-current 18 for each of the three current-sensors 14. The details of the algorithm or process or mathematical model by which the offset-current 18 for each of the three current-sensors 14 is determined will be described in more detail later. Once the offset-current 18 for each of the three current-sensors 14 is known, then the 'actual motor current' for each phase or winding is determined by simply adding (or subtracting) the 'measured motor current' (indicated by the analog-signals 22) and the offset-current 18 for each of the three current-sensors 14.

It was observed that even when the offset-currents 18 are well-known because they were determines in a noise-free laboratory environment, the sum of the winding-currents indicated by analog-signals 22 did not always add up to zero, which suggested that there may be some form of current-leakage in the motor 12, and/or there may be differences in gain among the current-sensors 14. As such, the controller may also be configured to determine a leakage-current 30 based on the plurality of the measurements, and further determine the offset-current 18 of each of the three current-sensors 14 based on the x-offset 24, the y-offset 26, and the leakage-current 30.

The details of the algorithm will now be described beginning with some review. With typical alternating-current flow, the three current-sensors 14 will each detect a signal that is sinusoidal in nature. Direct measurement of DC offset from individual sensors under this situation isn't desirable, because it will require heavy filtering to remove fundamental frequency. As a consequence, DC offset extraction will be too slow. Instead of viewing problem from individual phase measurement, it was discovered that a linear combination of all phase currents in balanced three-phase machines behave similar to a rotating current vector (the rotating-vector 28) with magnitude I, as shown in FIGS. 2A and 2B. Typically, the rotating-vector 28 isn't a quantity that can be directly measured. Instead, current measurement from phase A, B, and C are measured by the A2D. From A2D measurement, the controller 16 performs signal processing to convert current measurement from A, B, and C into an orthogonal-axis (e.g. X-Y axis). From then, the rotating-vector 28 can be constructed. It is noted that the rotating-vector 28 has a relatively constant magnitude. If there are substantive values of offset-currents from individual phase currents (A-B-C), it will change the relative position of the origin 32 of the rotating-vector 28, but the magnitude will stay constant, as shown in FIG. 2B. The offsets as shown in FIG. 2B are also a generally constant quantity, at least for short time intervals, less than one minute for example. The system 10 provides a way to track current vector in FIG. 2B, such that offset-current 18 for each of the three current-sensors 14 can be determined.

The purpose of the FIG. 2B is to show that there is constant magnitude current vector I (the rotating-vector 28) that is rotating in space, but the origin 32 is offset by sensor DC bias. More accurate representation when DC offset is presence is shown in FIG. 3. As seen in the figures, there are two main reference frames, the one on the left side is machine reference frame, and the one on right side is sensor reference frames. The correct current quantity is the one viewed from machine frame. When current is viewed from sensor frame, it is biased by DC offset (dcx and dcy) from machine frame. Green lines (X-Y axis) on both frames are stationary orthogonal axis in-which individual current sensor reading from a-b-c axis will be projected to. By having current quantities represented in X-Y axis, will provide convenient way to manipulate the signals.

Having described reference frames (FIG. 3) where DC current offset can be extracted, key features of the system are now described, where the key features include that the system 10 combines measured current signal and mathematical model to predict the offset-current 18 of each of the three current-sensors 14, and that the system 10 can be implemented into a real time structure.

Figure 4:
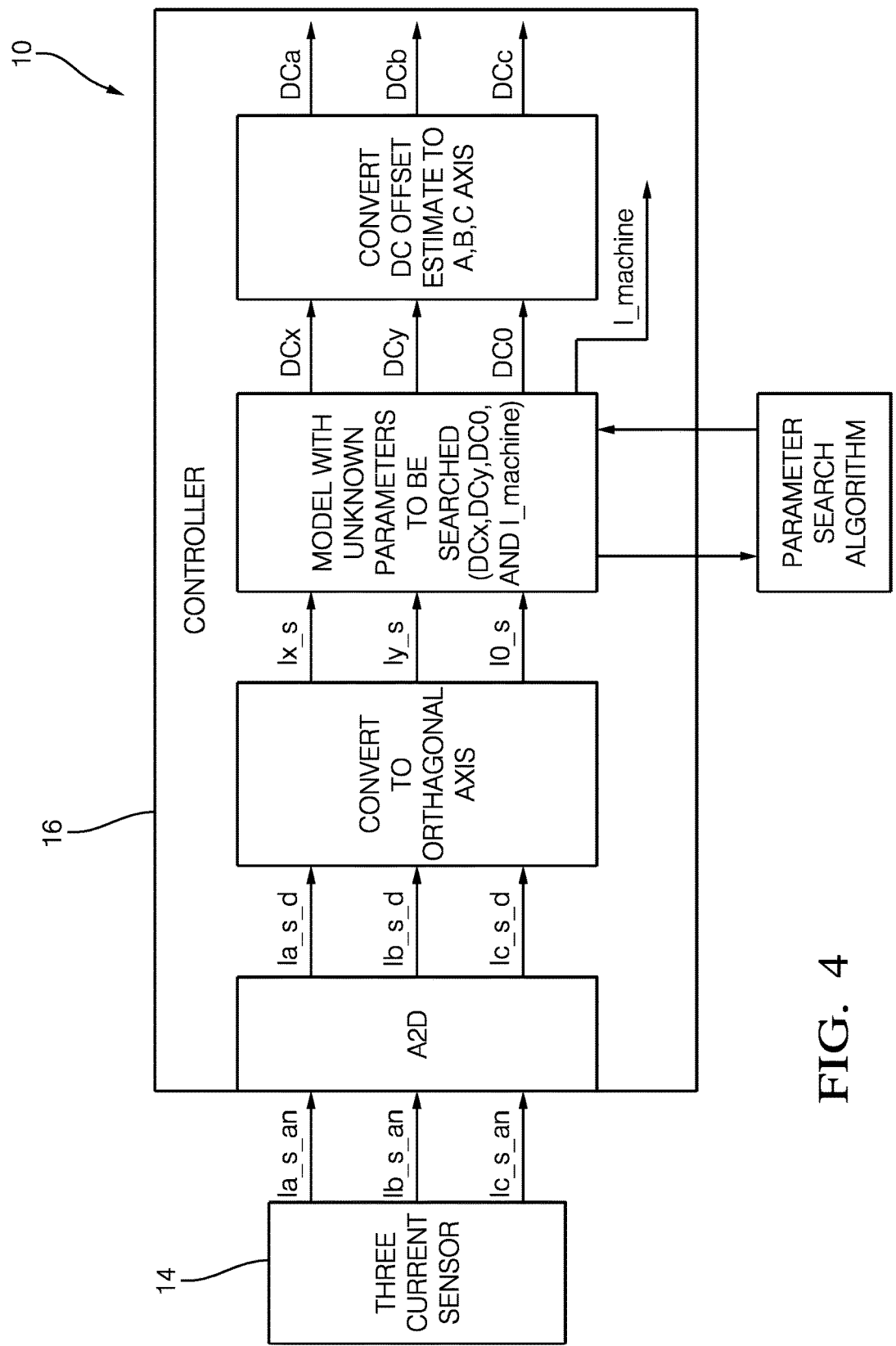
FIG. 4 is a diagram of a controller used in the system of FIG. 1 in accordance with one embodiment.

FIG. 4 illustrates further details of the system 10, in particular the controller 16. Phase current from the motor 12 is converted from analog to digital data by the A2D at fixed period. Internally within controller 16, currents are converted into an orthogonal frame 34 so that current vector (Ix and Iy) can be constructed. The model will collect current vector information until sufficient data is collected, and then DC offset quantity will be predicted. As final step, predicted DC offset quantity will be converted into A, B, C frame from the orthogonal frame 34.

There are two additional advantages of the system 10 other than the fact that the offset-current 18 can be estimated with current flowing. First, algorithm can converge within few electrical cycles (less than 10 electrical cycles). It can be further sped up if angle theta_s is updated with additional inner iterations loop. Second, testing has shown that in the presence of measurement noise, the algorithm can still maintain its convergence stability and produces decent prediction of offset-current 18 and current magnitude.

Figure 5:
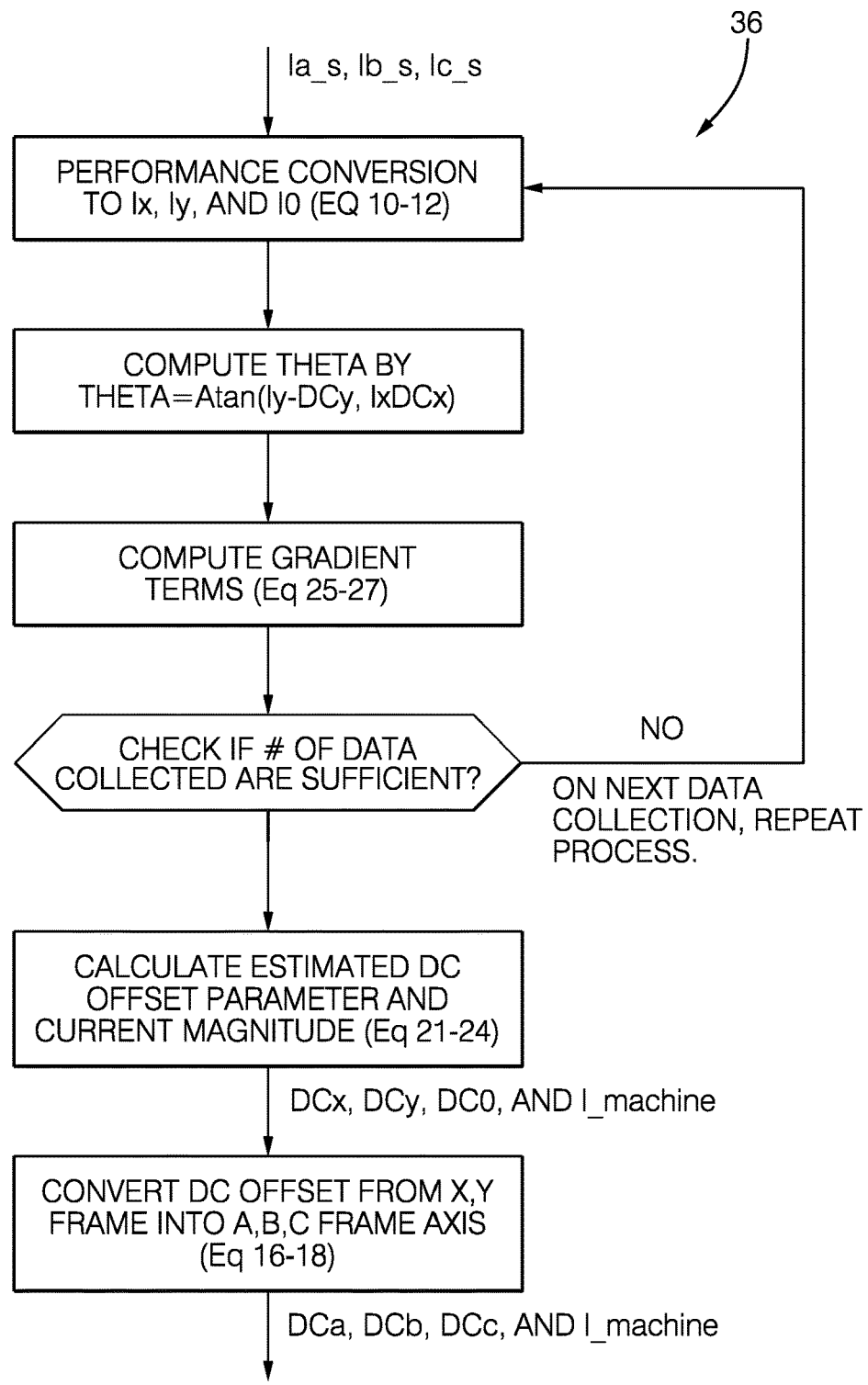
FIG. 5 is a flowchart of a method used by the system of FIG. 1 in accordance with one embodiment.

The signal path illustrated in FIG. 4 describes relationship between measured current in sensor and machine frame. Detail derivations of the model are shown in Eqs. 1-18. From the model, current DC offset and machine current magnitude can be related to measured sensor signal by Eqs. 10-12. From these equations, the parameters DCx, DCy, DC0, and I_machine that can satisfy the equations can be determined. The method or process used to search for the parameters is gradient-descent. The method is selected because it isn't computationally expensive. In this approach, signal data can be processed one at a time, and parameter prediction can be outputted once enough data are collected. Eqs. 19-28 show detail derivation of gradient descent approach. A non limiting example of a method 36 is shown in FIG. 5.

The mathematical model derivation (see a) starts from sensor reference frame. In this reference frame, machine performs measurement of phase A, B, and C current. Then, the currents quantity can be projected into orthogonal axis through trigonometry relation as follows:

$$Ix\_s=\tfrac{2}{3}*(Ia_s-Ib\_s*\cos[60]-Ic\_s*\cos[60]) \qquad \text{Eq. 1,}$$

$$Iy\_s=\tfrac{2}{3}*(Ib\_s*\cos[30]-Ic\_s*\cos[30]) \qquad \text{Eq. 2, and}$$

$$I0\_s=\tfrac{2}{3}*(Ia\_s+Ib\_s+Ic\_s) \qquad \text{Eq. 3,}$$

where "_s" indicates that currents are viewed from sensor reference frame.

Under assumption that the motor is running at steady-state speed, current quantities per phase (phase A, B, C) will be sinusoidal with constant magnitude. However, the presence of DC offset will make peak value of phase current to be unsymmetrical. By referencing to FIG. 3, per phase current quantities in sensor reference frame Eq. 1-3 are related to machine frame by following equations:

$$Ia\_s = I\_machine \cdot \cos[theta] + DCa \quad \text{Eq. 4,}$$

$$Ib\_s = I\_machine \cdot \cos[theta-120] + DCb \quad \text{Eq. 5, and}$$

$$Ic\_s = I\_machine \cdot \cos[theta-240] + DCc \quad \text{Eq. 6,}$$

where I_machine is constant current amplitude as seen by machine reference frame.

By plugging Eqs. 4-6 into Eqs. 1-3 followed by simplification, following result is obtained:

$$Ix\_s = I\_machine \cdot \cos[theta] + (\tfrac{2}{3} \cdot DCa - \tfrac{1}{3} \cdot DCb - \tfrac{1}{3} \cdot DCc) \quad \text{Eq. 7,}$$

$$Iy\_s = I\_machine \cdot \sin[theta] + (\tfrac{1}{3} \cdot DCb - DCc) \quad \text{Eq. 8, and}$$

$$I0\_s = \tfrac{2}{3} \cdot (DCa + DCb + DCc) \quad \text{Eq. 9.}$$

For convenience, new terms DCx, DCy, and DCo are introduced such that Eqs. 7-9 can be re-written as:

$$Ix\_s = I\_machine \cdot \cos[theta] + DCx \quad \text{Eq. 10,}$$

$$Iy\_s = I\_machine \cdot \sin[theta] + DCy \quad \text{Eq. 11, and}$$

$$I0\_s = DC0 \quad \text{Eq. 12,}$$

where, $$DCx = \tfrac{2}{3} \cdot DCa - \tfrac{1}{3} \cdot DCb - \tfrac{1}{3} \cdot DCc \quad \text{Eq. 13,}$$

$$DCy = \tfrac{1}{3} \cdot \sqrt{3} \cdot (DCb - DCc) \quad \text{Eq. 14, and}$$

$$DCy = \tfrac{1}{3} \cdot \sqrt{3} \cdot (DCb - DCc) \quad \text{Eq. 15.}$$

DC quantities in X-Y frame can be easily transform back into A,B,C quantities by inverting Eqs. 13-15 as shown by Eqs. 16-18. However, for convenience of further mathematical manipulation, conversion can be postponed until DC current quantities are extracted in the orthogonal X-Y frame.

$$DC_a = DC_X + \tfrac{1}{2} \cdot DC_0 \quad \text{Eq. 16,}$$

$$DC_b = -\tfrac{1}{2} \cdot DC_X + \tfrac{1}{2} \cdot \sqrt{3} \cdot DC_Y + \tfrac{1}{2} \cdot DC_0 \quad \text{Eq. 17, and}$$

$$DC_c = -\tfrac{1}{2} \cdot DC_X - \tfrac{1}{2} \cdot \sqrt{3} + \tfrac{1}{2} \cdot DC_0 \quad \text{Eq. 18.}$$

By careful inspection of Eqs. 10-12, equation variables can be separated into known and unknown quantities. The known quantities Ix_s, Iy_s, and I0_s can be obtained from sensor measurements. These variables are located on left side of the equations. The unknown quantities are I_machine, DCx, DCy, DC0, and theta. DC0 can be estimated directly by Eq. 9, however, for a reason that will described later DC0 will kept as an unknown for now. Another realization from Eqs. 10-12 is that most of the unknown quantities are constant, except theta. Therefore, regression model to search for their values might be suitable candidate. Below, a strategy to solve these parameters using regression model will be described.

The main idea of regression model can be summarized as follow, for a given model with unknown parameters and their measured values, it is preferable to predict parameters value that will minimize error between model output and its measured quantity. Measured quantities and model parameters have been discussed above. First, it is preferable to construct cost-function that will allow minimization of the error to be performed conveniently. Proposed cost-function equation is derived by performing summation of square difference between left and right terms of Eqs. 10-12, as shown below.

$$J = \frac{1}{2 \cdot N} \sum_{m=1}^{N} (Ix\_s(m) - I\_machine \cdot \cos[theta(m)] - DCx)^2 + \quad \text{Eq. 19}$$
$$(Iy\_s(m) - I\_machine \cdot \sin[theta(m)] - DCy)^2 +$$
$$(I0\_s(m) - DC0)^2.$$

In Eq. 19, superscript (m) indicates m-th sample points of the data. Note, in this equation, theta(m) is treated as known quantity. It is computed/estimated on estimated sample point of Ix_s and Iy_s and given previous prediction of DCx and DCy (DCx_0 and DCy_0), by Eq. 20 below:

$$theta(m) = \arctan((Iy\_s(m) - DCy\_0)/(Ix\_s(m) - DCx\_0)) \quad \text{Eq. 20.}$$

Theta(m) calculated from Eq. 20 will not be correct within iteration, since it is an estimated value. However, as predicted parameters are converging theta(m) will be close to its true machine frame. DC0 in general should be equal to I0_s(m) when there is no noise in the measurement. However, solution of regression model will look over several sample data points then it performs average solution of the parameter. Therefore, in the presence of measurement noise, using DC0 value from model estimation is better than its instantaneous value.

Parameters that will minimize cost function (Eq. 19) are solved iteratively by gradient descend method. Final solutions of the method are described below, for each predicted parameters:

$$DCx\_1 = DCx\_0 - \frac{\partial J}{\partial DCx}, \quad \text{Eq. 21}$$

$$DCy\_1 = DCy\_0 - \frac{\partial J}{\partial DCy}, \quad \text{Eq. 22}$$

$$DC0\_1 = DC0\_0 - \frac{\partial J}{\partial DC0}, \text{ and} \quad \text{Eq. 23}$$

$$I\_machine\_1 = I\_machine\_0 - \frac{\partial J}{\partial I\_machine}, \quad \text{Eq. 24}$$

where "_1" and "_0" in Eqs. 21-24 are to distinguish current from previous iteration value, respectively.

Gradient terms from Eqs. 21-24 are further derived by Eqs. 25-28:

$$\frac{\partial J}{\partial DCx} = \frac{1}{N} \cdot \sum_{m=1}^{N} (I\_machine \cdot \cos[theta(m)] + DCx - Ix(m)), \quad \text{Eq. 25}$$

$$\frac{\partial J}{\partial DCy} = \frac{1}{N} \cdot \sum_{m=1}^{N} (I\_machine \cdot \sin[theta(m)] + DCy - Iy(m)), \quad \text{Eq. 26}$$

$$\frac{\partial J}{\partial DC0} = \frac{1}{N} \cdot \sum_{m=1}^{N} (DC0 - I0(m)), \text{ and} \quad \text{Eq. 27}$$

$$\frac{\partial J}{\partial I\_machine} = \frac{1}{N} \cdot \sum_{m=1}^{N} (I\_machine \cdot \cos[theta(m)] + DCx - Ix(m)) \cdot \quad \text{Eq. 28}$$
$$\cos[theta(m)] + (I\_machine \cdot \sin[theta(m)] + DCy - Iy(m)) \cdot$$
$$\sin[theta(m)]).$$

That is, Eqs. 21-28 are core functions in which DC current offset can be estimated along with current magnitude. The implementation of algorithm above is shown by FIG. 5. As shown in the figure, computational steps are broken down into several steps summarized. To save computational cost in real-time application, computation is performed iteratively as follow:

a. Gradient terms (Eq. 25-28) are computed/updated per new data arrival instead of performing computation in a batch.
b. Decision logic is used to check if gradient calculations have accumulated enough data (e.g. 1 electrical cycle of data). Only when enough data has been accumulated, parameters update can be performed.

Since (a) and (b) aren't necessarily occur in a same real-time step, computational cost can be minimized.

Accordingly, an electric-motor-control system (the system 10), a controller 16 for the system 10, and a method 36 of operating the system 10 is provided.

While this invention has been described in terms of the preferred embodiments thereof, it is not intended to be so limited, but rather only to the extent set forth in the claims that follow.

I claim:

1. An electric-motor-control system with current sensor offset correction, said system comprising:
three current-sensors, wherein each of the three current-sensors is configured to detect current through one of three windings of a Y-connected motor; and
a controller in communication with the three current-sensors, wherein the controller is configured to:
record periodically measurements of sensed-current indicated by each current-sensor while variable-current flows through each of the three windings;
determine an x-offset and a y-offset of a rotating-vector indicated by a plurality of the measurements; and
determine an offset-current of each of the three current-sensors based on the x-offset and the y-offset.

2. The system in accordance with claim 1, wherein the controller is further configured to:
determine a leakage-current based on the plurality of the measurements; and
determine the offset-current of each of the three current-sensors based on the x-offset, the y-offset, and the leakage-current.

* * * * *